(12) United States Patent
Matsui et al.

(10) Patent No.: US 9,318,454 B2
(45) Date of Patent: Apr. 19, 2016

(54) DRIVE CHIP AND DISPLAY APPARATUS

(71) Applicant: Sharp Kabushiki Kaisha, Osaka-shi, Osaka (JP)

(72) Inventors: Takashi Matsui, Osaka (JP); Takeshi Horiguchi, Osaka (JP); Motoji Shiota, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 14/433,711

(22) PCT Filed: Oct. 7, 2013

(86) PCT No.: PCT/JP2013/077238
§ 371 (c)(1),
(2) Date: Apr. 6, 2015

(87) PCT Pub. No.: WO2014/057908
PCT Pub. Date: Apr. 17, 2014

(65) Prior Publication Data
US 2015/0279792 A1 Oct. 1, 2015

(30) Foreign Application Priority Data
Oct. 11, 2012 (JP) ................................ 2012-225663

(51) Int. Cl.
*H01L 23/48* (2006.01)
*H01L 23/52* (2006.01)
(Continued)

(52) U.S. Cl.
CPC ............ *H01L 24/06* (2013.01); *G02F 1/13452* (2013.01); *H01L 23/49811* (2013.01); *H01L 23/49838* (2013.01); *H01L 24/14* (2013.01); *H01L 24/81* (2013.01); *H01L 24/83* (2013.01); *H01L 24/29* (2013.01); *H01L 2224/0401* (2013.01); *H01L 2224/0603* (2013.01); *H01L 2224/06131* (2013.01); *H01L 2224/06133* (2013.01); *H01L 2224/06135* (2013.01);
(Continued)

(58) Field of Classification Search
CPC ... H01L 21/2007; H01L 21/187; H01L 23/48; H01L 23/52; H01L 23/3114; H01L 23/53219; H01L 23/53233; H01L 24/10; H01L 27/0814; H01L 29/40; H01L 29/6603; H01L 51/5296
USPC ............. 257/786, 773, 737, 79, 13, 347, 678, 257/734, E21.007, E21.05, E21.053, 257/E21.32, E21.352, E21.366, E21.499, 257/E21.508
See application file for complete search history.

(56) References Cited

U.S. PATENT DOCUMENTS 6,750,552 B1 * 6/2004 Narayanan ............ H01L 21/563
257/786
7,061,117 B2 * 6/2006 Yang ........................ H01L 23/50
257/773
(Continued)

*Primary Examiner* — David Nhu
(74) *Attorney, Agent, or Firm* — Keating & Bennett, LLP

(57) ABSTRACT

This drive chip has a configuration that is provided with: a base main body; two terminal groups that are respectively disposed along the base main body sides in the longitudinal direction of the base main body, said sides facing each other; a narrow-pitch section in one terminal group wherein terminals are disposed in a zigzag manner in two or more rows, said narrow-pitch section having a narrow terminal pitch in the longitudinal direction; a rough pitch section in the one terminal group, said rough pitch section having a terminal pitch in the longitudinal direction wider than that of the narrow pitch section; and a dummy bump that is disposed between the two terminal groups, said dummy bump being disposed parallel to the rough pitch section.

10 Claims, 7 Drawing Sheets

(51) Int. Cl.
*H01L 29/40* (2006.01)
*H01L 23/00* (2006.01)
*G02F 1/1345* (2006.01)
*H01L 23/498* (2006.01)

(52) U.S. Cl.
CPC ............... *H01L2224/06177* (2013.01); *H01L 2224/1403* (2013.01); *H01L 2224/14131* (2013.01); *H01L 2224/14133* (2013.01); *H01L 2224/14135* (2013.01); *H01L 2224/14177* (2013.01); *H01L 2224/14515* (2013.01); *H01L 2224/293* (2013.01); *H01L 2224/2929* (2013.01); *H01L 2224/8185* (2013.01); *H01L 2224/81139* (2013.01); *H01L 2224/81203* (2013.01); *H01L 2224/83139* (2013.01); *H01L 2224/83203* (2013.01); *H01L 2224/83851* (2013.01); *H01L 2924/12041* (2013.01); *H01L 2924/3511* (2013.01); *H01L 2924/381* (2013.01)

(56) References Cited

U.S. PATENT DOCUMENTS 7,209,207 B2 * 4/2007 Ting .................... G02F 1/13452
349/149
7,403,256 B2 * 7/2008 Ting .................... G02F 1/13452
349/149

* cited by examiner

DRIVE CHIP AND DISPLAY APPARATUS

TECHNICAL FIELD

The present invention relates to drive chips, and to display apparatuses provided with drive chips.

BACKGROUND ART

Conventionally, liquid crystal display devices are used as medium- to small-size display devices for use in portable information terminals and the like. A liquid crystal display device incorporates a drive chip for driving a liquid crystal panel, and to make the liquid crystal display device slim, the drive chip is mounted directly on the liquid crystal panel on a COG (chip-on-glass) basis. In a COG process, typically, an ACF (anisotropic conductive film) is held between a drive chip and a liquid crystal panel, and these are compression-bonded together at high temperature so that the drive chip and the liquid crystal panel are electrically connected together.

Today, increasingly slim liquid crystal display devices are sought, and accordingly increasingly slim drive chips are sought. Inconveniently, however, making a drive chip slim causes it to sag under heat during compression bonding. This may lead to defective electrical connection between the drive chip and the liquid crystal panel.

Patent Document 1 identified below discloses a drive chip comprising: a base body including a face having a first end portion and a second end portion parallel to the longer sides and a third end portion and a fourth end portion parallel to the shorter sides perpendicular to the longer sides; a number of input terminals formed in the first end portion along the longer sides of the base body; a number of first output terminals arranged in the second end portion along the longer sides; and dummy terminals formed between the input terminals and the first output terminals. Here, the dummy terminals are formed in one or more rows along the longer sides.

LIST OF CITATIONS

Patent Literature

Patent Document 1: Japanese Patent Application Publication No. 2005-203758

SUMMARY OF THE INVENTION

Technical Problem

Inconveniently, however, according to Patent Document 1, dummy terminals are arranged in one or more rows in the direction of the longer sides of the drive chip, and thus a sufficient area for circuitry cannot be secured without increasing the size of the drive chip; this makes it difficult to secure a sufficient area for circuitry.

An object of the present invention is to provide a drive chip that makes it possible to secure a sufficient area for circuitry and simultaneously to prevent defective connection by suppressing a warp. Another object of the present invention is to provide a display device incorporating such a drive chip.

Means for Solving the Problem

To achieve the above objects, according to one aspect of the present invention, a drive chip includes: a base body; two groups of terminals arranged respectively along opposite sides of the base body in its lengthwise direction; a narrow-pitch portion in which, with respect to one of the groups whose terminals are arranged in two or more rows in a staggered formation, terminals are arranged at a narrow lengthwise-direction pitch; a rough-pitch portion in which, with respect to said one group of terminals, terminals are arranged at a broader lengthwise-direction pitch than in the narrow-pitch portion; and a bump provided between the two groups of terminals, in the rough-pitch portion.

Advantageous Effects of the Invention

According to the present invention, a dummy bump provided on a drive chip suppresses a sag in the drive chip under heat during compression-bonding in a COG process. As a result, the drive chip and a liquid crystal panel are kept parallel to each other, and thus defective electrical connection between the drive chip and the liquid crystal panel is prevented. Moreover, owing to the dummy bump being provided in a rough-pitch portion which is not crowded with circuitry, it is possible to secure a sufficient area for circuitry without increasing the size of the drive chip.

DESCRIPTION OF EMBODIMENTS

Embodiments of the present invention will be described below with reference to the accompanying drawings.

Figure 1:
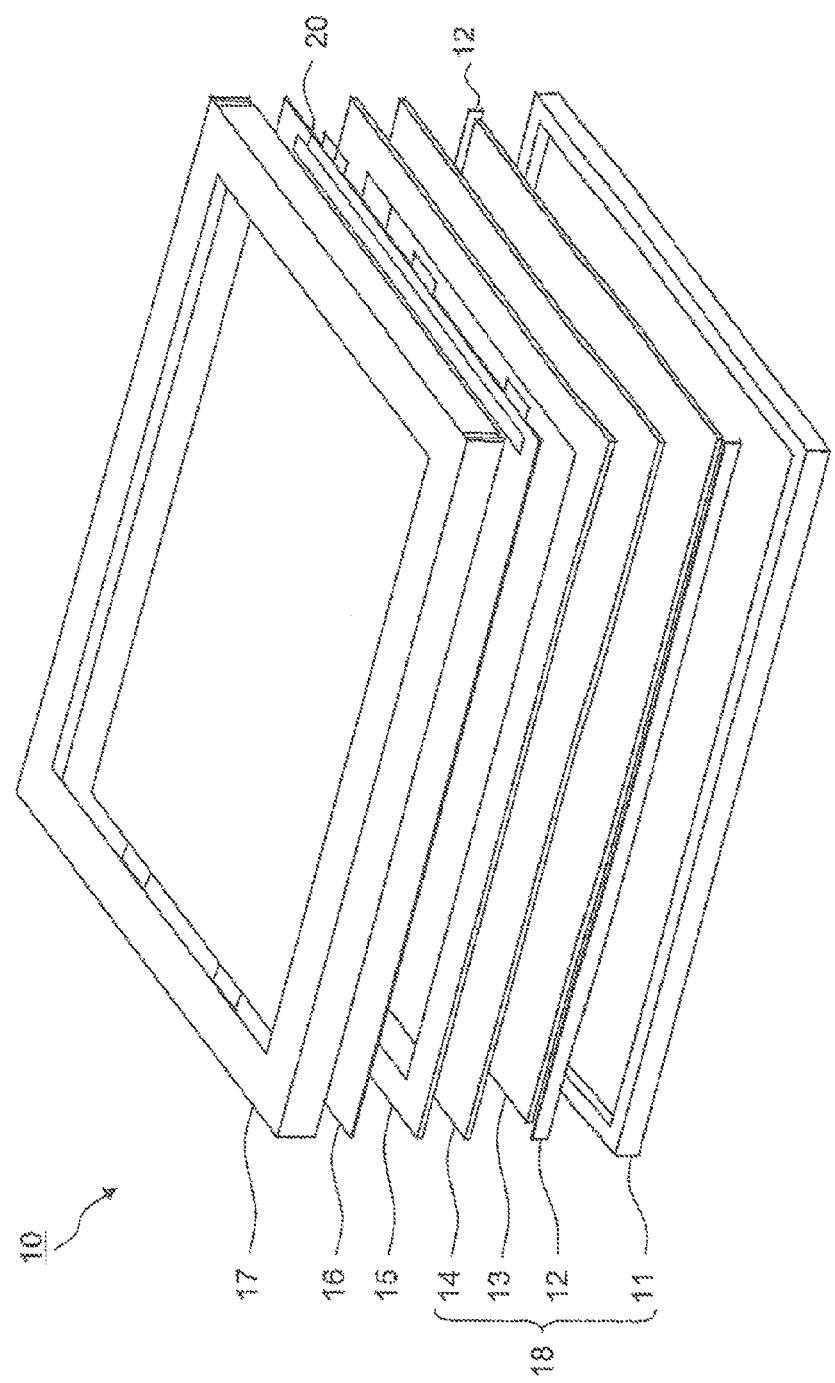
FIG. 1 is an exploded perspective view showing a liquid crystal display device according to one embodiment of the present invention.

FIG. 1 is an exploded perspective view showing a liquid crystal display device according to one embodiment of the present invention. In FIG. 1, the liquid crystal display device 10 is depicted as lying horizontally with its display surface pointing up.

The liquid crystal display device 10 is for use as a display in televisions and computers. The liquid crystal display device 10 includes a backlight chassis 11, light source units 12, a light guide plate 13, an optical sheet 14, a panel frame 15, a liquid crystal panel 16 with a drive chip 20 mounted on it, and a bezel 17. The backlight chassis 11, the light source units 12, the light guide plate 13, and the optical sheet 14, when assembled together, constitute a unit which is referred to as a backlight device 18.

The backlight chassis 11 is a box-shaped member which serves as a base for mounting on it (housing in it) the components of the backlight device 18, namely the light source units 12, the light guide plate 13, the optical sheet 14, etc. As the material for the backlight chassis 11, to obtain satisfactory rigidity and heat dissipation, it is preferable to use SECC (sheet steel) or Al to name a few.

The light source units 12 each include LEDs (light-emitting diodes) as point light sources and an LED board on which the LEDs are mounted. As light sources, instead of LEDs, fluorescent lamps or the like as linear light sources may be used. On the LED board, a plurality of LEDs are arranged at predetermined intervals along one side of the light guide plate 13. The light source units 12 are arranged to constitute an edge-lit construction. In a large-size liquid crystal display device, with consideration given to heat dissipation and mechanical strength, used as the LED board is typically a metal board of Al or the like.

As a means for fastening the light source units 12 to the backlight chassis 11, it is possible to use screws or adhesive. Although, in FIG. 1, two light source units 12 are arranged along opposite side faces of the light guide plate 13, it is also possible to arrange a light source unit 12 along only one side face of the light guide plate 13, or additionally arrange a light source unit 12 along another side face of the light guide plate 13. In short, a light source unit 12 can be arranged along at least one side face of the light guide plate 13. Here, each such side face faces LEDs, and serves as a light entry portion (light entry surface) through which light from the LEDs enters the light guide plate 13.

The light guide plate 13 has a pair of main faces (a top and a bottom face) and a plurality of side faces (in FIG. 1, four faces) formed between them. The light guide plate 13 is a member which converts the light from the LEDs that has entered it through an end face (side face) into planar light and which then emits the planar light through the top face. As the material for the light guide plate 13, it is preferable to use, from the viewpoint of thickness reduction and weight reduction, resin such as acrylic resin or PC (polycarbonate).

The optical sheet 14 collectively refers to one, or a combination of more than one, out of a diffuser sheet, a lens sheet, a luminance enhancement sheet, etc. The optical sheet 14 is laid over the light guide plate 13, and serves to shine light evenly on the liquid crystal panel 16. Thus, a crease or a sag in the sheet results in degraded display quality.

The panel frame 15 is a picture frame-shaped member which holds the liquid crystal panel 16 in such a way that it does not make contact with the optical sheet 14. As the material for the panel frame 15, it is preferable to use resin such as PC. The panel frame 15 also serves to suppress a warp or a sag.

The liquid crystal panel 16 is a member composed of two transparent substrates with a liquid crystal element held between them. While the liquid crystal element is driven under the control of the drive chip 20, the liquid crystal panel 16 is illuminated by the backlight device 18 and thereby an image is displayed.

The drive chip 20 includes a base body, a plurality of input terminals, and a plurality of output terminals, and is mounted on the liquid crystal panel 16 on a COG basis. The drive chip 20 converts image data fed in from the outside into a drive signal fit for the driving of the liquid crystal panel 16, and feeds the drive signal to the liquid crystal panel with optimal timing.

The bezel 17 is a picture frame-shaped member which holds and secures the liquid crystal panel 16 in position, and is placed over the box-shaped backlight chassis 11 as if a lid. As the material for the bezel 17, it is possible to use SECC or AL, or, for weight reduction, PC, ABS resin, CFRP (carbon fiber-reinforced plastic), or the like. For further weight reduction, by use of any of these materials, the bezel 17 may be molded integrally with a housing (unillustrated) as an outer casing.

In the liquid crystal display device 10 structured as described above, the drive chip 20 is devised to be distinctive of the present invention. Now, embodiments of the drive chip 20 will be described in detail.

<First Embodiment>

Figure 2:
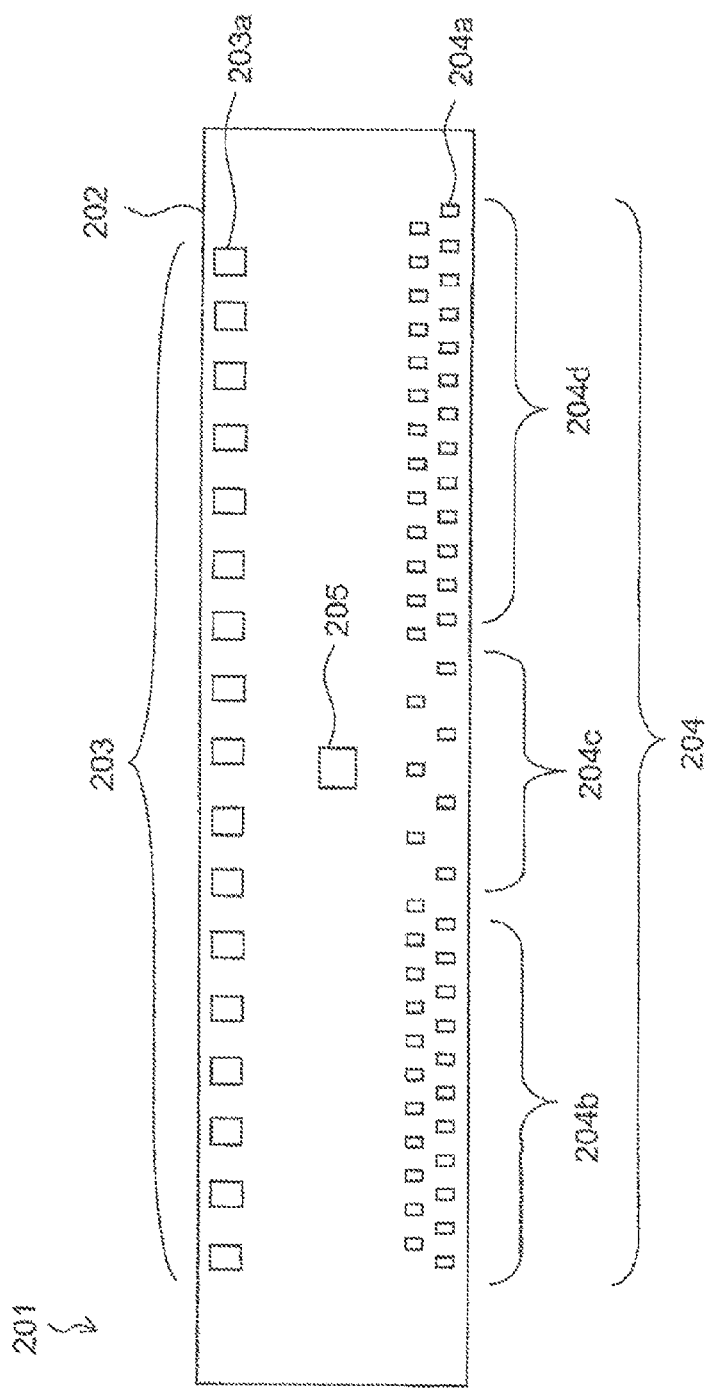
FIG. 2 is a plan view of a drive chip according to a first embodiment of the present invention.

FIG. 2 is a plan view of a drive chip according to a first embodiment of the present invention. As one embodiment of the drive chip 20 described previously, a drive chip 201 according to the first embodiment has a base body 202, a group of input terminals 203, a group of output terminals 204, and a dummy bump 205.

The base body 202 is an electrically insulating member of which the face on which the groups of terminals are arranged is rectangular in shape. The base body 202 has, for example, a thickness of 0.2 mm or less and a length of 1.5 mm or more in its widthwise direction (i.e., the direction along shorter sides). Inside the base body 202 is provided a semiconductor element (unillustrated) for converting an image signal fed in from the outside into a drive signal necessary for driving.

The group of input terminals 203 and the group of output terminals 204 are two groups of terminals arranged respectively along opposite sides of the base body 202 in its lengthwise direction (i.e., the direction along longer sides). In the group of input terminals 203, rectangular terminals 203a are formed at equal intervals in one row, in a straight formation. The group of input terminals 203 may comprise two or more rows.

In the group of output terminals 204, rectangular terminals 204a, which are smaller than input terminals, are formed in two rows, in a staggered formation. In a central part of the group of output terminals 204 in the lengthwise direction, to secure an area for circuitry, the terminals 204a are arranged at a broader lengthwise-direction pitch than elsewhere (than in narrow-pitch portions 204b and 204d, which will be described later), and this part is referred to as a rough-pitch portion 204c. On the other hand, on both sides of the rough-pitch portion 204c, no area for circuitry needs to be secured, and thus the terminals 204a are arranged densely, at a narrower pitch than in the rough-pitch portion 204c; these parts are referred to as narrow-pitch portions 204b and 204d. The group of output terminals 204 may comprise three or more rows.

The arrangement formations of the group of input terminals 203 and the group of output terminals 204 may be switched so that the group of input terminals 203 is arranged in a staggered formation and the group of output terminals is arranged in a straight formation. The groups of terminals 203 and 204 may both be arranged in a staggered formation, or in a straight formation in two or more rows.

The dummy bump 205 is a bump that is electrically connected to nowhere. The dummy bump 205 is arranged approximately at the center of the base body 202. That is, the dummy bump 205 is arranged between the group of input terminals 203 and the group of output terminals 204, in the rough-pitch portion 204c. The height (thickness) of the dummy bump 205 is equal to the height (thickness) of the group of input terminals 203 and the group of output terminals 204. The dummy bump 205 has a larger area than each of the terminals 203a and 204a. Instead of the dummy bump 205, a functional bump that is electrically connected to somewhere may be provided.

Figure 3:
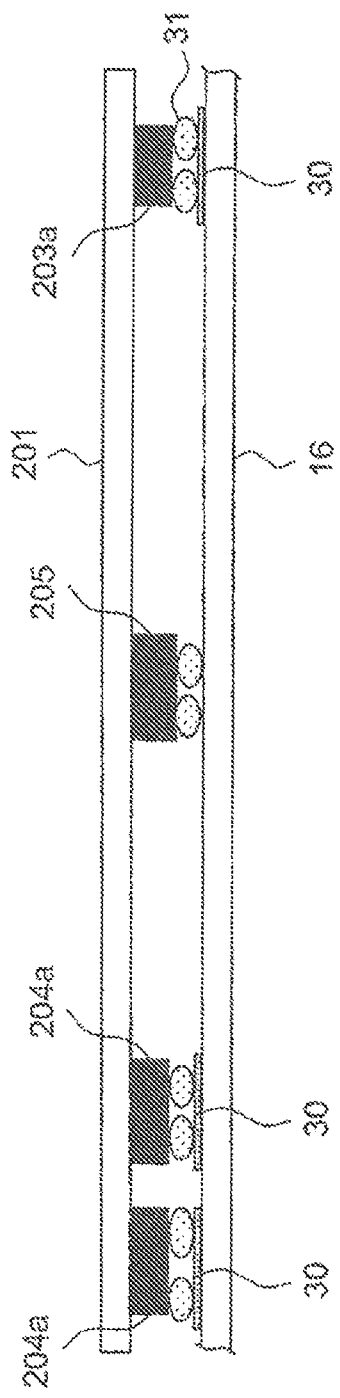
FIG. 3 is a widthwise-direction sectional view of a drive chip in a liquid crystal display device incorporating a drive chip according to the first embodiment.

FIG. 3 is a widthwise-direction sectional view of the drive chip 201 in a liquid crystal display device incorporating the drive chip 201 according to the first embodiment. By use of a liquid crystal panel 16 having conductor lines 30 formed on it, an ACF (anisotropic conductive film) 31 is held between the drive chip 201 and the liquid crystal panel 16, and these are compression-bonded together under heat by a COG process so that the groups of terminals 203 and 204 are electrically connected to the conductor lines 30. In FIG. 3, the ACF 31 is schematically depicted by a large number of electrically conductive particles contained in it. The dummy bump 205 is compression-bonded to the liquid crystal panel 16 via the ACF 31.

Figure 4:
FIG. 4 is a widthwise-direction sectional view of a drive chip in a liquid crystal display device incorporating a drive chip of a comparative example.

FIG. 4 is a widthwise-direction sectional view of a drive chip in a liquid crystal display device incorporating a drive chip of a comparative example. Compared with the drive chip 201 of the first embodiment, the drive chip 100 of the comparative example has no dummy bump 205.

As described above, the base body has a thickness as small as 0.2 mm or less, and has a widthwise-direction dimension as large as 1.5 mm or more; thus, the drive chip 100 sags in the widthwise direction under heat during compression bonding in the COG process, and the liquid crystal panel 16 sags in the opposite direction so as to be warped backward. As a result, a gap larger than is supposed to be appears between the liquid crystal panel 16 and, in particular, the terminals 204a in an outer row in the group of output terminals 204; thus, there, the electrically conductive particles in the ACF 31 do not have satisfactory particle flatness, resulting in defective electrical connection between the drive chip 100 and the liquid crystal panel 16.

By contrast, in the liquid crystal display device incorporating the drive chip 201 according to the first embodiment, owing to the provision of the dummy bump 205, the sag in the drive chip 201 under heat during compression bonding in the COG process is suppressed. As a result, the drive chip 201 and the liquid crystal panel 16 are kept parallel to each other (see FIG. 3); accordingly, the electrically conductive particles in the ACF 31 in contact with all the terminals 203a and 204a have satisfactory particle flatness, and thus defective electrical connection between the drive chip 201 and the liquid crystal panel 16 is prevented.

Moreover, in the drive chip 201 according to the first embodiment, the dummy bump 205 is provided in the rough-pitch portion 204c, which is not crowded with circuitry. Thus, it is possible to secure a sufficient area for circuitry without increasing the size of the drive chip 201.

<Second Embodiment>

Figure 5:
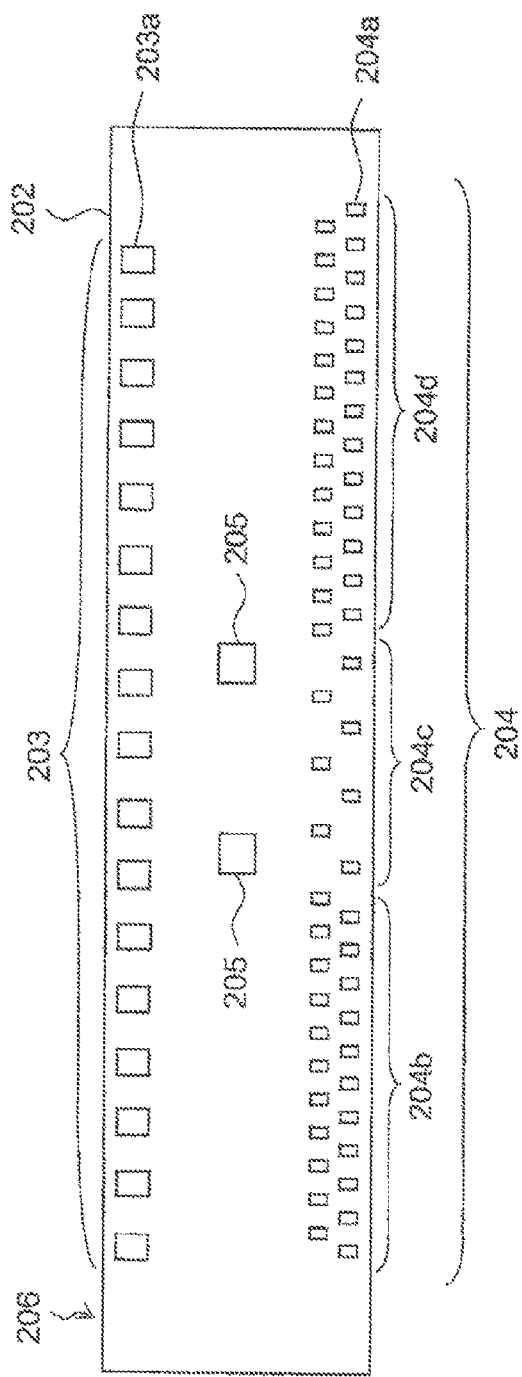
FIG. 5 is a plan view of a drive chip according to a second embodiment of the present invention.

FIG. 5 is a plan view of a drive chip according to a second embodiment of the present invention. As another embodiment of the drive chip 20 described previously, a drive chip 206 according to the second embodiment has two dummy bumps 205 each like the one in the first embodiment. Otherwise, such parts as find their counterparts in the first embodiment are identified by common reference signs, and will not be discussed in detail.

As shown in FIG. 5, the two dummy bumps 205 are arranged approximately at the center of the base body 202, side by side in the lengthwise direction. That is, the two dummy bumps 205 are arranged between the group of input terminals 203 and the group of output terminals 204, in the rough-pitch portion 204c.

Figure 6:
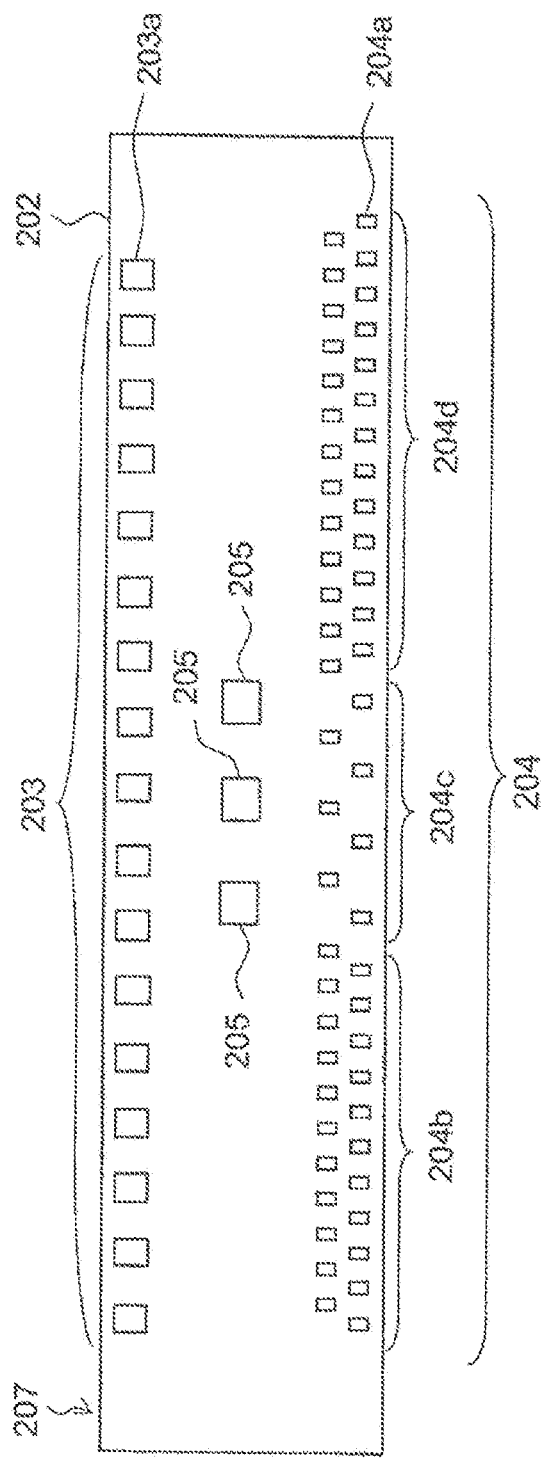
FIG. 6 is a plan view of another drive chip according to the second embodiment of the present invention.

FIG. 6 is a plan view of another drive chip according to the second embodiment of the present invention. As yet another embodiment of the drive chip 20 described previously, another drive chip 207 according to the second embodiment has three dummy bumps 205 each like the one in the first embodiment. As shown in FIG. 6, the three dummy bumps 205 are arranged approximately at the center of the base body 202, in a row in the lengthwise direction. That is, the three dummy bumps 205 are arranged between the group of input terminals 203 and the group of output terminals 204, in the rough-pitch portion 204c.

In the second embodiment, four or more dummy bumps 205 may be provided. In this way, a drive chip according to the second embodiment is provided with a plurality of dummy bumps 205, and this makes it possible to secure a sufficient area for circuitry and simultaneously to prevent, more reliably, defective electrical connection between the drive chip and the liquid crystal panel 16. As in the first embodiment, the dummy bumps 205 may be replaced with functional bumps.

<Third Embodiment>

Figure 7:
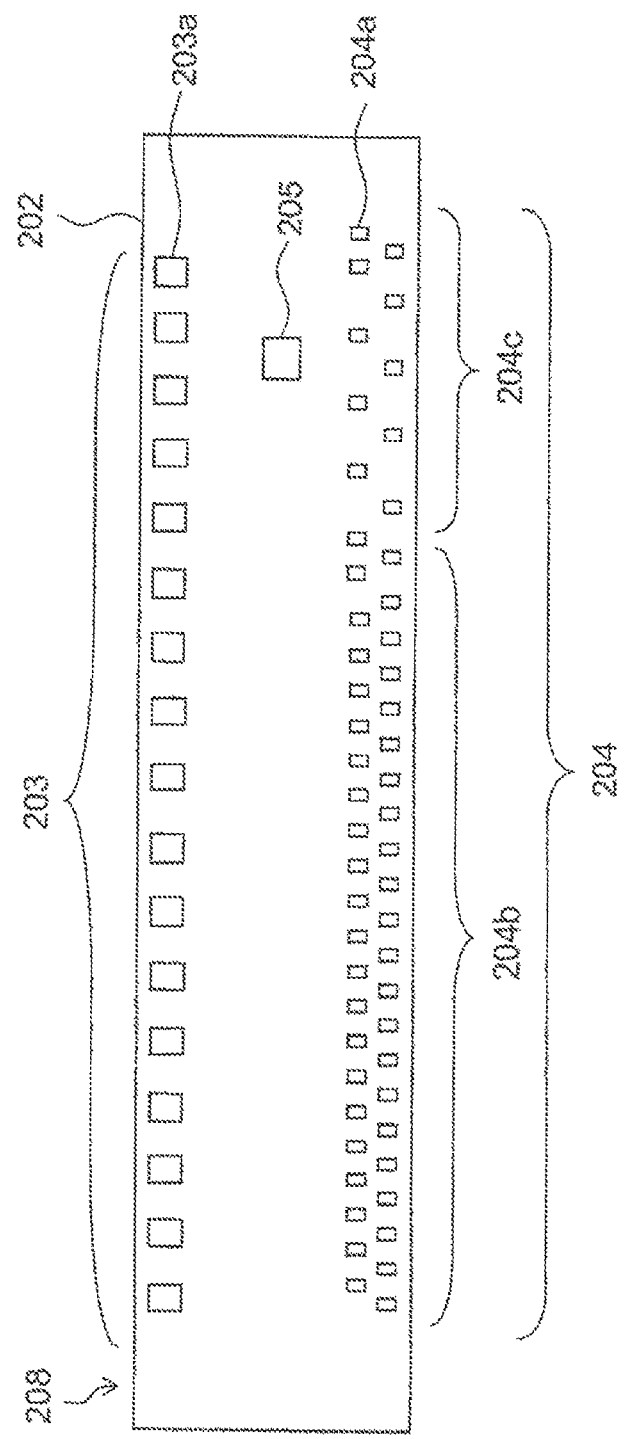
FIG. 7 is a plan view of a drive chip according to a third embodiment of the present invention.

FIG. 7 is a plan view of a drive chip according to a third embodiment of the present invention. As still another embodiment of the drive chip 20 described previously, a drive chip 208 according to the third embodiment has a rough-pitch portion 204c arranged in an end part of the group of output terminals 204 in the lengthwise direction. Otherwise, such parts as find their counterparts in the first embodiment are identified by common reference signs, and will not be discussed in detail.

As shown in FIG. 7, a dummy bump 205 is arranged near an end part of the base body 202 in the lengthwise direction. That is, the dummy bump 205 is arranged between the group of input terminals 203 and the group of output terminals 204, in the rough-pitch portion 204c in a row.

Even in a case as described above where the rough-pitch portion 204c is arranged near an end part of the base body 202, by arranging the dummy bump 205 in the rough-pitch portion 204c, it is possible to secure a sufficient area for circuitry and simultaneously to prevent defective electrical connection between the drive chip and the liquid crystal panel 16. As in the first embodiment, the dummy bump 205 may be replaced with a functional bump. In the third embodiment, as in the second embodiment, a plurality of dummy bumps 205 may be provided.

INDUSTRIAL APPLICABILITY

Drive chips according to the present invention find application in display devices such as liquid crystal display devices, and are suitably used, in particular, in medium- to small-size liquid crystal display devices for use in portable information terminals and the like.

LIST OF REFERENCE SIGNS 10 liquid crystal display device
11 backlight chassis
12 light source unit
13, 21, 31, 41 light guide plate
14 optical sheet
15 panel frame
16 liquid crystal panel
17 bezel
18 backlight device
30 conductor line
31 ACF
201, 206-208 drive chip
202 base body
203 input terminal
203a, 204a terminal
204 output terminal
204b, 204d narrow-pitch portion
204c rough-pitch portion
205 dummy bump

The invention claimed is:
1. A drive chip comprising:
a base body;

two groups of terminals that are arranged respectively along opposite sides of the base body in a lengthwise direction thereof;

a narrow-pitch portion in which, with respect to one of the two groups whose terminals are arranged in two or more rows in a staggered formation, terminals are arranged at a narrow lengthwise-direction pitch;

a rough-pitch portion in which, with respect to said one group of terminals, terminals are arranged at a broader lengthwise-direction pitch than in the narrow-pitch portion; and a bump that is provided between the two groups of terminals, in the rough-pitch portion.

2. The drive chip according to claim 1, wherein the bump comprises a plurality of bumps.

3. The drive chip according to claim 1, wherein the rough-pitch portion is arranged in a central part of said one group of terminals.

4. The drive chip according to claim 1, wherein the rough-pitch portion is arranged in an end part of said one group of terminals.

5. The drive chip according to claim 1, wherein the two groups of terminals which have the rough-pitch portion are groups of output terminals.

6. The drive chip according to claim 1, wherein the bump is a dummy bump which is electrically connected to nowhere.

7. The drive chip according to claim 1, wherein the bump is a functional bump which is electrically connected to somewhere.

8. The drive chip according to claim 1, wherein the two groups of terminals and the bump have an equal height.

9. The drive chip according to claim 1, wherein the bump has a larger area than each of the terminals of the two groups.

10. A display device having the drive chip according to claim 1 mounted thereon on a chip-on-glass basis.

* * * * *